US010256795B1

(12) United States Patent
Penney

(10) Patent No.: US 10,256,795 B1
(45) Date of Patent: Apr. 9, 2019

(54) PIPELINED LATCHES TO PREVENT METASTABILITY

(71) Applicant: Micron Technology, Inc., Boise, ID (US)

(72) Inventor: Daniel B. Penney, Wylie, TX (US)

(73) Assignee: Micron Technology, Inc., Boise, ID (US)

(*) Notice: Subject to any disclaimer, the term of this patent is extended or adjusted under 35 U.S.C. 154(b) by 16 days.

(21) Appl. No.: 15/730,233

(22) Filed: Oct. 11, 2017

(51) Int. Cl.
H03K 3/037 (2006.01)
G11C 7/10 (2006.01)
G06F 13/16 (2006.01)
G06F 9/38 (2018.01)

(52) U.S. Cl.
CPC ......... *H03K 3/0375* (2013.01); *G06F 13/161* (2013.01); *G06F 13/1642* (2013.01); *G11C 7/1039* (2013.01); *G06F 9/383* (2013.01)

(58) Field of Classification Search
CPC . G06F 11/0745; G06F 11/073; G06F 11/0703
See application file for complete search history.

(56) References Cited

U.S. PATENT DOCUMENTS

| 5,440,515 | A | * | 8/1995 | Chang | G11C 7/22 327/271 |
| 6,091,662 | A | * | 7/2000 | Mochida | G11C 7/1039 365/205 |
| 6,104,653 | A | * | 8/2000 | Proebsting | G11C 7/065 257/E21.659 |
| 6,650,149 | B1 | * | 11/2003 | Wong | H03K 5/1252 327/14 |
| 7,391,245 | B2 | * | 6/2008 | Heyne | H03K 5/133 327/149 |
| 8,630,131 | B1 | * | 1/2014 | Shiao | G11C 5/04 326/30 |
| 8,901,971 | B1 | * | 12/2014 | Chan | H04L 25/0272 326/82 |
| 9,619,310 | B2 | * | 4/2017 | El-Wailly | H04L 1/004 |
| 9,899,992 | B1 | * | 2/2018 | Sadowski | H03K 3/0375 |
| 2003/0198110 | A1 | * | 10/2003 | Hasegawa | G11C 7/12 365/200 |
| 2004/0218705 | A1 | * | 11/2004 | Cranford, Jr. | H03L 7/07 375/355 |

(Continued)

Primary Examiner — Adam D Houston
(74) Attorney, Agent, or Firm — Fletcher Yoder, P.C.

(57) ABSTRACT

Memory devices may receive data from data processing devices for storage and processing during write operations. The received data may be accompanied by a data strobing signal that informs the memory device that data available in the bus is ready for latching. The data strobing signal may be provided via a tri-stateable or bidirectional connection and, as a result, during initialization of a write operation, the input circuitry may suffer from metastability during an initial transient period. The present application discusses methods and systems that may mitigate metastability by preventing invalid states in the input circuitry when data strobing signal is invalid or disabled. Certain embodiments determine if the data strobing signal is a valid input and, accordingly, adjust the received signal to a fixed value or to a previously received value. The use of latches and differential amplifiers to perform these functions is also discussed.

20 Claims, 7 Drawing Sheets

(56) References Cited

U.S. PATENT DOCUMENTS

| | | | |
|---|---|---|---|
| 2007/0159225 A1* | 7/2007 | Bucossi | G06F 1/04 327/291 |
| 2008/0071489 A1* | 3/2008 | Wissel | G01R 31/3016 702/79 |
| 2009/0128211 A1* | 5/2009 | Saito | H03K 3/356113 327/210 |
| 2009/0289684 A1* | 11/2009 | Kashiwagi | H03K 5/1252 327/306 |
| 2011/0043262 A1* | 2/2011 | Watanabe | G11C 7/1087 327/158 |
| 2015/0249559 A1* | 9/2015 | Shokrollahi | H04L 25/03006 375/257 |
| 2015/0326210 A1* | 11/2015 | Beerel | H03K 3/037 326/94 |
| 2016/0034014 A1* | 2/2016 | Turullols | G01R 31/31725 713/320 |
| 2016/0035399 A1* | 2/2016 | Yaraduyathinahalli | G11C 7/10 365/189.17 |
| 2016/0110492 A1* | 4/2016 | Huang | G06F 17/5081 716/113 |
| 2016/0133309 A1 | 5/2016 | Maryan et al. | |
| 2018/0054187 A1* | 2/2018 | Sadowski | H03K 5/13 |
| 2018/0248549 A1* | 8/2018 | Kim | H03K 19/00323 |
| 2018/0287774 A1* | 10/2018 | Wei | H04L 7/0331 |

\* cited by examiner

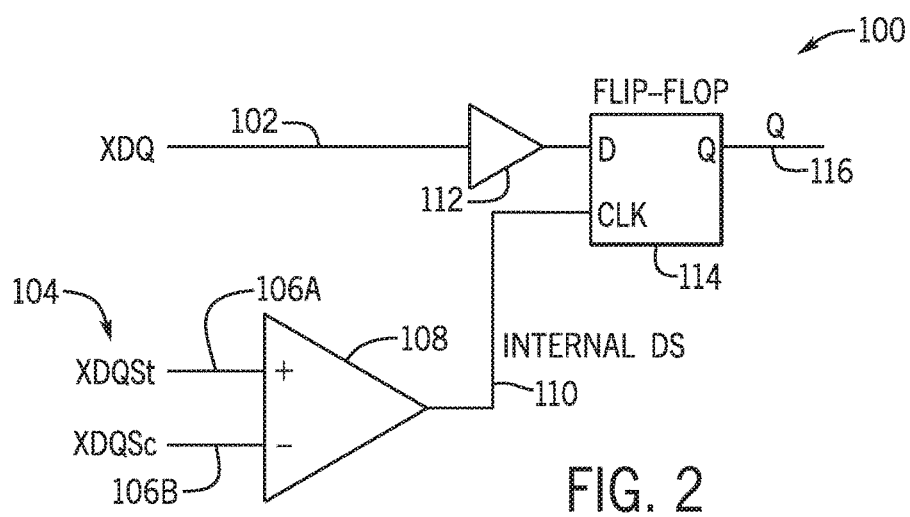
FIG. 2
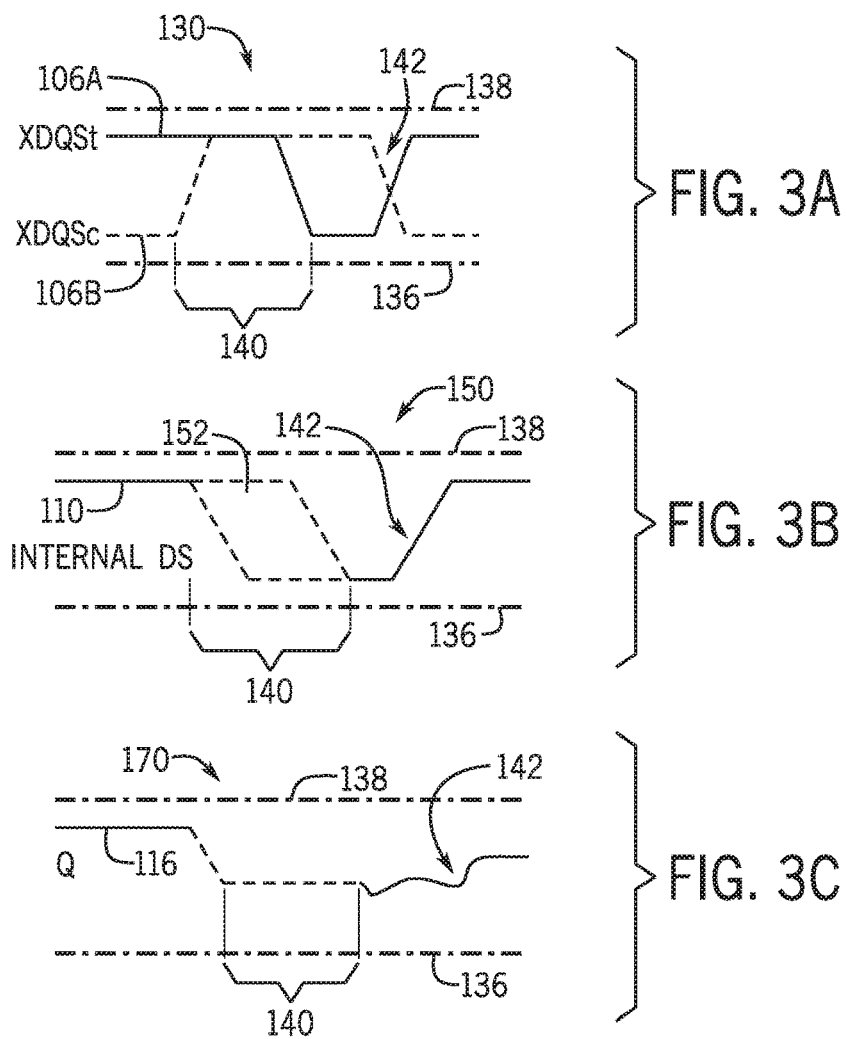
FIG. 3A
FIG. 3B
FIG. 3C

PIPELINED LATCHES TO PREVENT METASTABILITY

BACKGROUND

1. Field of the Invention

The present disclosure relates to memory devices, and more specifically to methods to mitigate metastability effects in clocking signals during data access in memory devices.

2. Description of the Related Art

Random access memory (RAM) devices, such as the ones that may be employed in electrical devices to provide data processing and/or storage, may provide direct availability to addressable data storage cells that form the memory circuitry of the device. Certain RAM devices, such as dynamic RAM (DRAM) devices may, for example, have multiple memory banks having many addressable memory elements. RAM devices may also have a command interface that may receive addresses and instructions (e.g., read, write, etc.) for operations that may be associated with those addresses and decoding circuitry that may process the instructions and the addresses to access the corresponding memory banks.

Commands and data to access to the addressable memory elements may be provided by processing circuitry of an electrical device that may be external to the memory or RAM device. During a write process, the electrical device may provide clocking signals, such as strobe clock signals, to allow the RAM devices to synchronize the received commands and data. During a read process, the memory device may provide clocking data strobe signals synchronized with the provided data to facilitate latching by the electrical device. In some systems, strobe signals may travel in a bidirectional electrical connection. As a result, the received clock signals may be enabled during a write operation in the memory device, and disabled during other operations or when the memory device is not being accessed. The disabled clock signal may cause uncertainty in the state of logic circuitry that processes data strobing and/or data inputs in the memory device, which may lead to metastability. The metastability may cause delays and/or lags when communication between processing circuitry and the memory device is reestablished and the clocking signal is resumed.

BRIEF DESCRIPTION OF THE DRAWINGS

Various aspects of this disclosure may better be understood upon reading the following detailed description and upon reference to the drawings in which:

FIG. 2 is a block diagram illustrating schematic circuitry that may be used in the memory device of FIG. 1 to capture input data using a clocking signal, in accordance with an embodiment;

FIGS. 3A, 3B, and 3C illustrate the effect of metastability in the capture of data illustrated in FIG. 2, in accordance with an embodiment;

DETAILED DESCRIPTION OF SPECIFIC EMBODIMENTS

Figure 1:
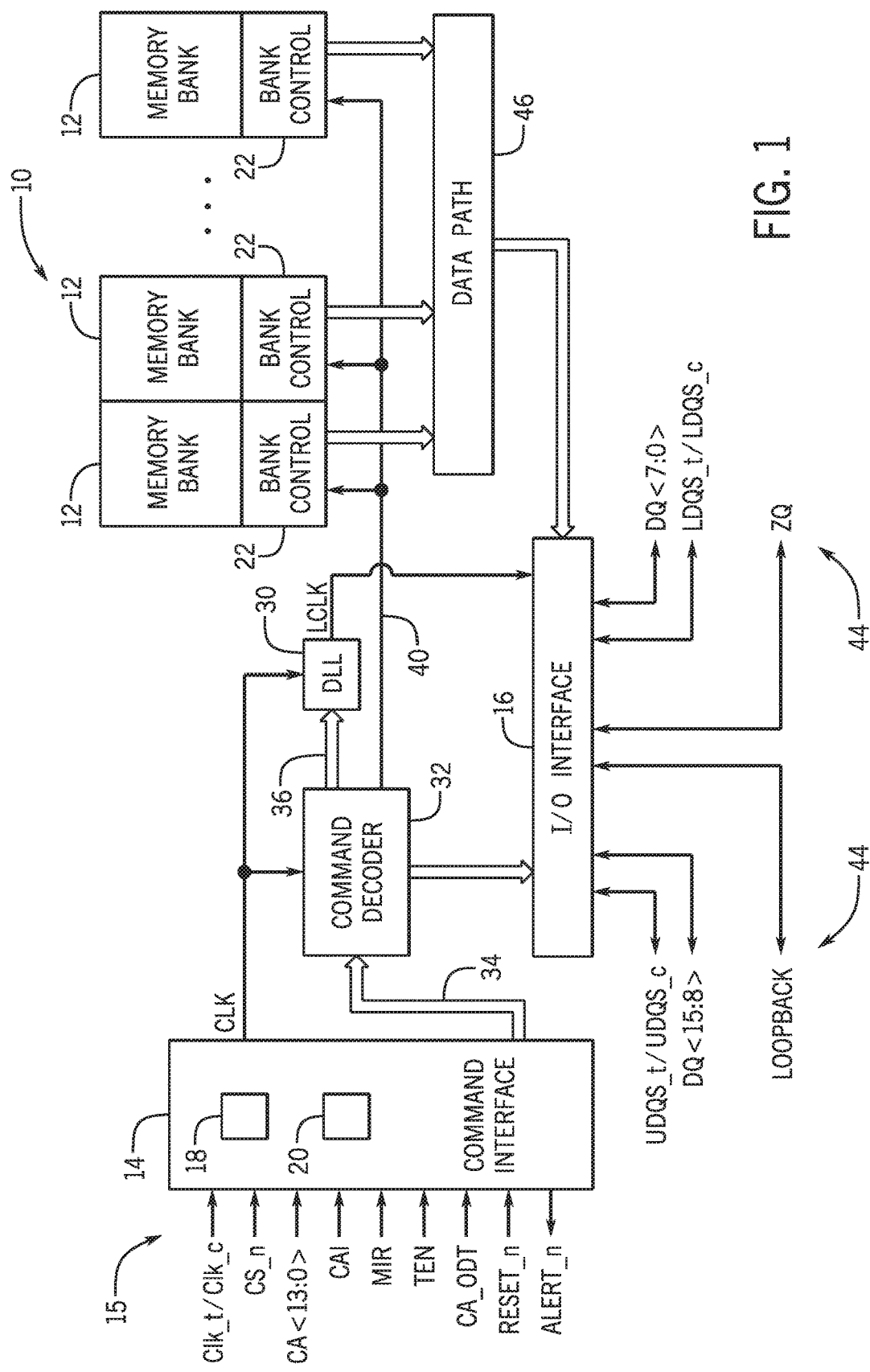
FIG. 1 is a block diagram illustrating an organization of a memory device that may benefit from the use of mitigated metastability using pipelined latches, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) devices that are coupled to processing circuitry, and may provide storage of data for processing. Examples of RAM devices include dynamic RAM (DRAM) devices and synchronous DRAM (SDRAM) devices, which may store individual bits electronically. The stored bits may be organized into addressable memory elements (e.g., words), which may be directly accessed by the processing circuitry. Memory devices may also include command circuitry to receive instructions and/or addresses from the processing circuitry. For example, in double data rate type five (DDR5) SDRAM devices, instructions and addresses may be provided by using a 14 bit command/address (CA) signal. Processing circuitry may also provide clocking signals to the memory device along with instructions and/or addresses. In many RAM devices, such as in DDR5 SDRAM devices, processing circuitry may provide a clocking signal Clk through a differential signal pair Clk_t and Clk_c to provide information to the memory device about when an instruction and/or an address signal is ready to be processed. Processing circuitry may also provide a data strobe signal DQS (e.g., data strobe clocking signal) to provide information to the memory device that data is available. DQS may also be provided via a differential signal pair DQS_t and DQS_c. For example, processing circuitry may provide a clocking signal and instructions to a DDR5 SDRAM device to indicate that a CA signal may be available (e.g., stable, ready) for processing during a transition (e.g., edge) of the Clk signal. If the available CA signal is a write command, the processing circuitry may, after a predetermined time, provide data in a data bus DQ along with the DQS to indicate that the data in DQ is ready to be stored. If the available CA signal is a read command, the DDR5 SDRAM device may, after a pre-determined time, provide data in a data bus DQ along with a DQS signal that clocks the data signal.

As discussed above, the DQS signal may be a bidirectional data line. As such, the DQS signal may be received by the memory device when performing write commands, and may be inactive during other periods. As a result, input circuitry that processes the received DQS signals may enter an unknown logic state, leading to uncertainty in the state and/or behavior of the DQS and/or DQ input circuitry in the beginning of a new write cycle. For example, latches and/or registers in a data path may be in a metastable (e.g., inconsistent, unknown, undesired) state, and may process initialization instructions incorrectly before returning to a valid, known state. Embodiments described herein relate to methods and systems that may prevent metastability in input circuitry by assigning specific voltages to a protected DQS line during an absence of a received DQS signal. Some embodiments may include gating of the received DQS signal using a set/reset latch pipeline and/or a comparator pipeline, as detailed below. These systems may allow a reduction in the lag in receiving and/or storing data after a write command, by reducing the recovery time from metastability. It should be noted that, while the embodiments described are related to memory circuitry, the methods and systems may be employed more generally in input circuitry where metastability may affect the performance.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10. As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for an x16 memory device, the IO signals may be divided into upper and lower IO signals (e.g., DQ<15:8>, or UDQ and DQ<7:0>, or LDQ) corresponding to upper and lower bytes of the data signals, for instance. In the present disclosure, XDQ may be used generally to refer tor UDQ or LDQ.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command), as discussed above. For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper data strobe signal UDQS and lower data strobe signals LDQS (e.g., UDQS_t/and UDQS_c; LDQS_t/and LDQS_c) corresponding to upper and lower bytes of data sent to and from the memory device 10, for instance. In the present disclosure, XDQS may be used generally to refer to DQS, UDQS, or LDQS.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

As discussed above and detailed below, circuitry in IO interface 16 may receive data and strobe signals to store (e.g., latch) the data to perform a write command. FIG. 2 illustrates a diagram of circuit 100 that receives the data signals XDQ 102 (e.g., DQ, UDQ, LDQ) and strobe signals XDQS 104. As discussed above, XDQS 104 may be received as a differential pair of signals XDQS_t 106A and XDQS_c 106B. Comparator circuitry 108 (e.g., a differential amplifier) may be used to generate a digital internal strobe signal DS 110. Circuit 100 may also include a delay buffer 112 which may delay incoming XDQ 102. The flip-flop 114 may be employed to store data from signal XDQ 102 using internal DS 110. Delay buffer 112 may be employed to provide a delay to incoming XDQ 102 to match latencies in the XDQS 104 path through differential amplifier 108. Latched data 116 may be made available to the data path 46, as discussed above. It should be appreciated that in a circuit having the architecture described in FIG. 1, IO interface 16 may have receive two strobe signals LDQS and UDQS that may be treated by two differential amplifiers to produced two internal strobe signals. In this architecture, each strobe signal may drive 8 flip-flops to latch 8 bits of data. The latched data may be provided to data path 46 to perform the write command.

As discussed above, during the beginning of a write cycle, the XDQS 104 may have uncertain and/or inconsistent (e.g., non-differential) signals. As a result, comparator output 108 may be uncertain and may drive the flip-flop 114 to an unknown state. This uncertainty in the state may lead to a metastable transient response. Diagrams 130 in FIG. 3A, 150 in FIG. 3B, and 170 in FIG. 3C illustrate the effect of metastability in circuity 100. Diagram 130 shows a time course of the pair of differential signals XDQS_t 106A and XDQS_c 106B between a low rail 136 and high rail 138 over time. In the diagram, the differential signals XDQS_t 106A and XDQS_c 106 present inconsistent voltages in region 140, which may correspond to a region prior to a write command during which the XDQS wires are not being driven by a processor. Following a write command, differential signals XDQS_t 106A and XDQS_c 106B may be adjusted to provide a first valid edge 142 to indicate arrival of the first bits of a write command.

Diagram 150 shows the internal DS 110 that results from processing signals XDQS of diagram 130. Note that during the unstable region 140, the inconsistency between differential signals XDQS_t 106A and XDQS_c 106B, which are not necessarily inverted with respect to each other, may lead to an uncertain signal 152 in region 140. Uncertain signal 152 may include peaks and glitches, as illustrated in this example, since comparator 108 may amplify noisy differences between the XDQS signals during region 140. Following region 140, comparator 108 may recover consistency prior to first edge 142. Note, however, that the delay may not be sufficient for flip-flop 114 to recover consistency, as illustrated in FIG. 3C that illustrates the latched data 116. Since the clock input of flip-flop 114 may receive the uncertain signal 152 during region 140, the internal state of the flip-flop during region 140 may be in metastability (e.g., unknown and/or inconsistent states). In some situations, recovery from a metastable state may not take place prior to the first edge 142. As a result, flip-flop 114 may not latch XDQ correctly in first edge 142, and the latched value Q 116 may be incorrect, leading to loss of data from the initial bits of the XDQ 102 stream.

Figure 4:
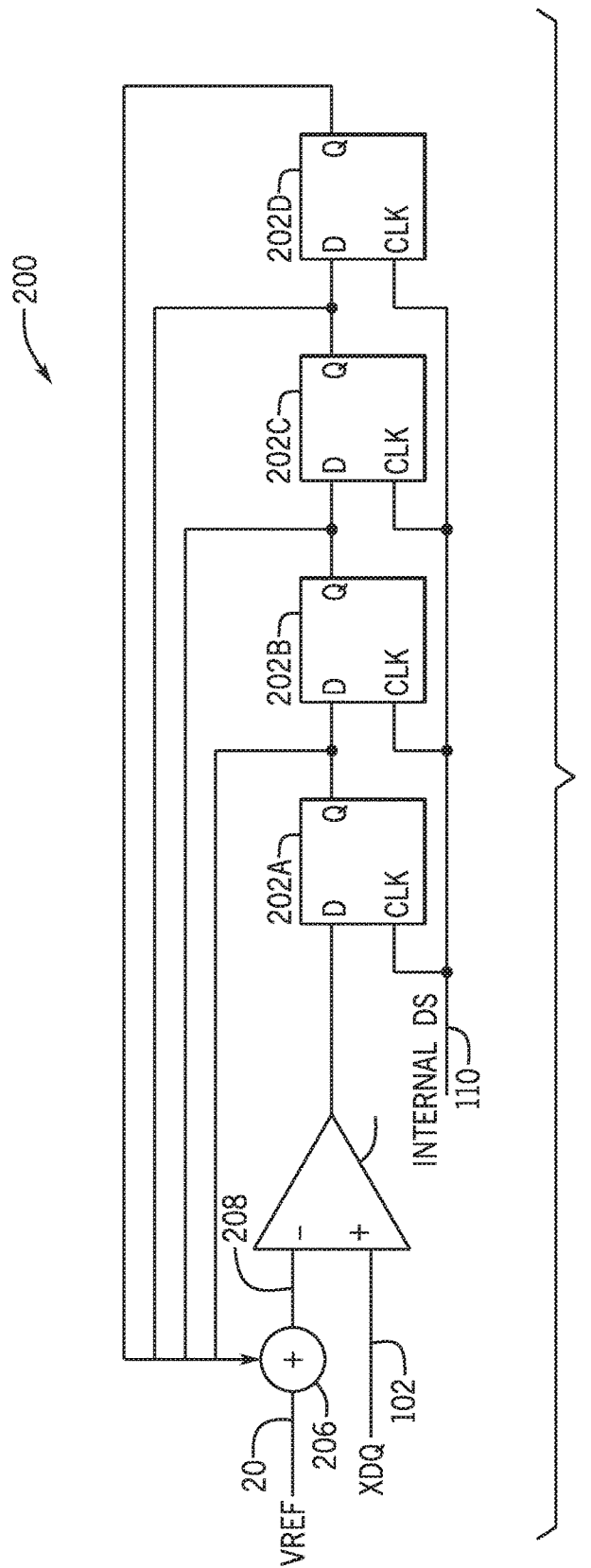
FIG. 4 is a block diagram illustrating schematic circuitry that may be used in the memory device of FIG. 1 to capture multiple bits of data using a clocking signal, in accordance with an embodiment.

Problems due to metastability may be worsened in situations employing additional feedback. For example, decision feedback equalization (DFE) circuit 200 in FIG. 4 illustrates a data input system that may be particularly vulnerable to metastability due to invalid internal DS 110. Circuit 200 may receive XDQ 102 and internal DS 110 produced from XDQS signals, and which may be used to latch four flip-flops 202A-D arranged in a pipeline. In the DFE circuit 200, XDQ 102 may be compared with an adjustable reference signal 208 provided via a feedback element (e.g., sum) 206. Adjustable reference signal 208 may be produced by feedback element 206 and the output of flip-flops 202A-D. Due to the pipeline arrangement of DFE circuit 200, metastability in internal DS 110 prior to a write command may lead to metastability in the flip-flops 202A-D and of the adjustable reference signal 208.

Figure 5:
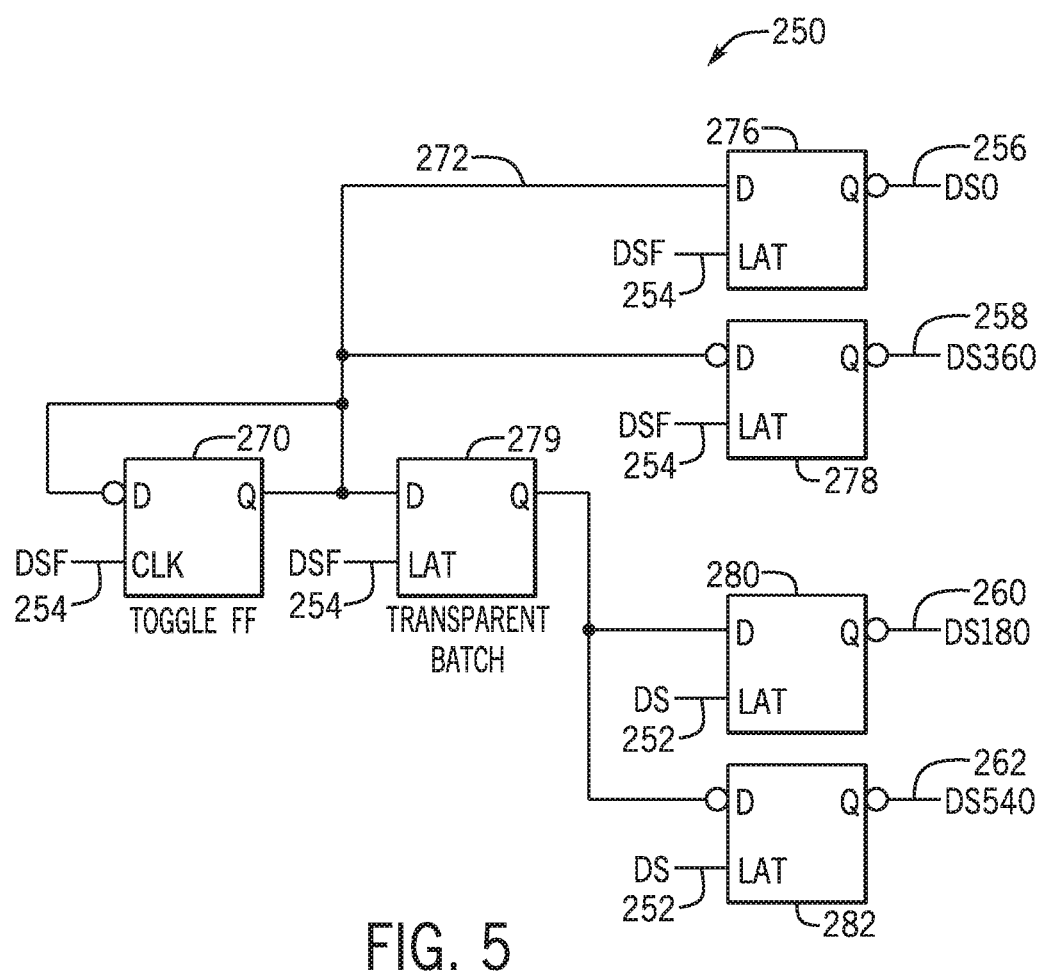
FIG. 5 is a block diagram illustrating schematic circuitry that may be used in the memory device of FIG. 1 to produce multiple half-rate clocking signals from a received clocking signal, in accordance with an embodiment.
Figure 6:
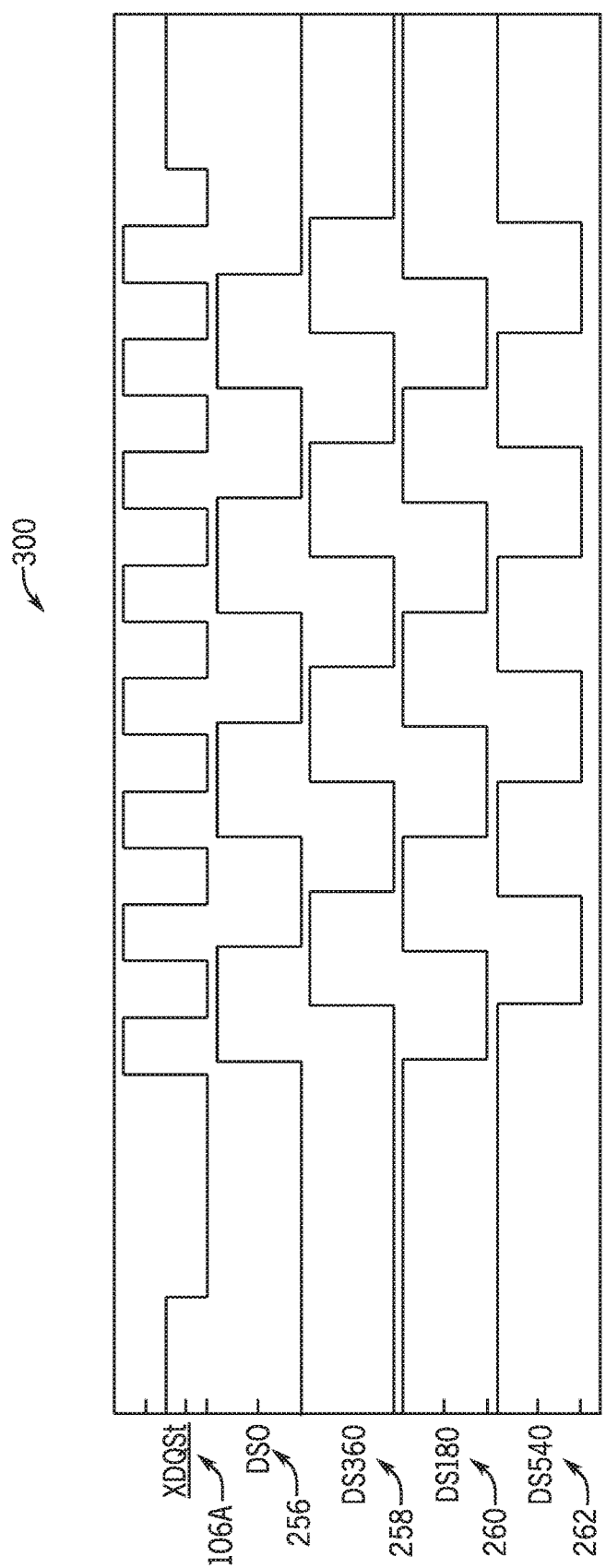
FIG. 6 is a diagram illustrating clocking signals that may be produced by the circuitry of FIG. 5, in accordance with an embodiment.

Another circuit in a memory device that may be particularly vulnerable to metastability is the four-phase DS generating circuit 250, illustrated in FIG. 5. The system illustrates an example in which metastability affects circuitry latches not directly associated with the received data signal. Circuit 250 receives an internal DS signal 252 and its complement DSF signal 254 and produces four signals 256, 258, 260, and 262, which may have half the frequency rate of DQS arrange in quadrature. For example, in certain standards, the XDQS signal may have a period of 500 ps and, as a result, signals 256, 258, 260, and 262 may have 1ns period. The relationship between the received XDQS_t 106A signal and the four quadrature signals DS0 256, DS360 258, DS180 260, and DS540 262 are illustrated in diagram 300 of FIG. 6. To produce the signals, circuit 250 may have a first toggle flip-flop 270 that is clocked by DSF signal 254, arranged in a toggling feedback loop. As a result, output signal 272 toggles at every positive edge of DSF signal 254, leading to a signal that has half-the frequency of DSF signal 254. Output signal 272 may be provided directly to flip-flop 276, which is clocked by DSF signal 254. The output of flip-flop 276 may be inverted to produce signal DS0 256. Output signal 272 may also be provided directly to flip-flop 278 after an inversion. The output of flip-flop 278 may be inverted to produce signal DS360 258. Output signal 272 may also be provided to a latch 279 that may be clocked by DSF signal 254. Latch 279 may add a one cycle delay to output signal 272, which may be provided directly to latches 280 and provided with an inversion to latch 282. The output of flip-flop 280 may be inverted to produce signal DS180 260, and the output of flip-flop 276 may be inverted to produce signal DS540 262.

Figure 7:
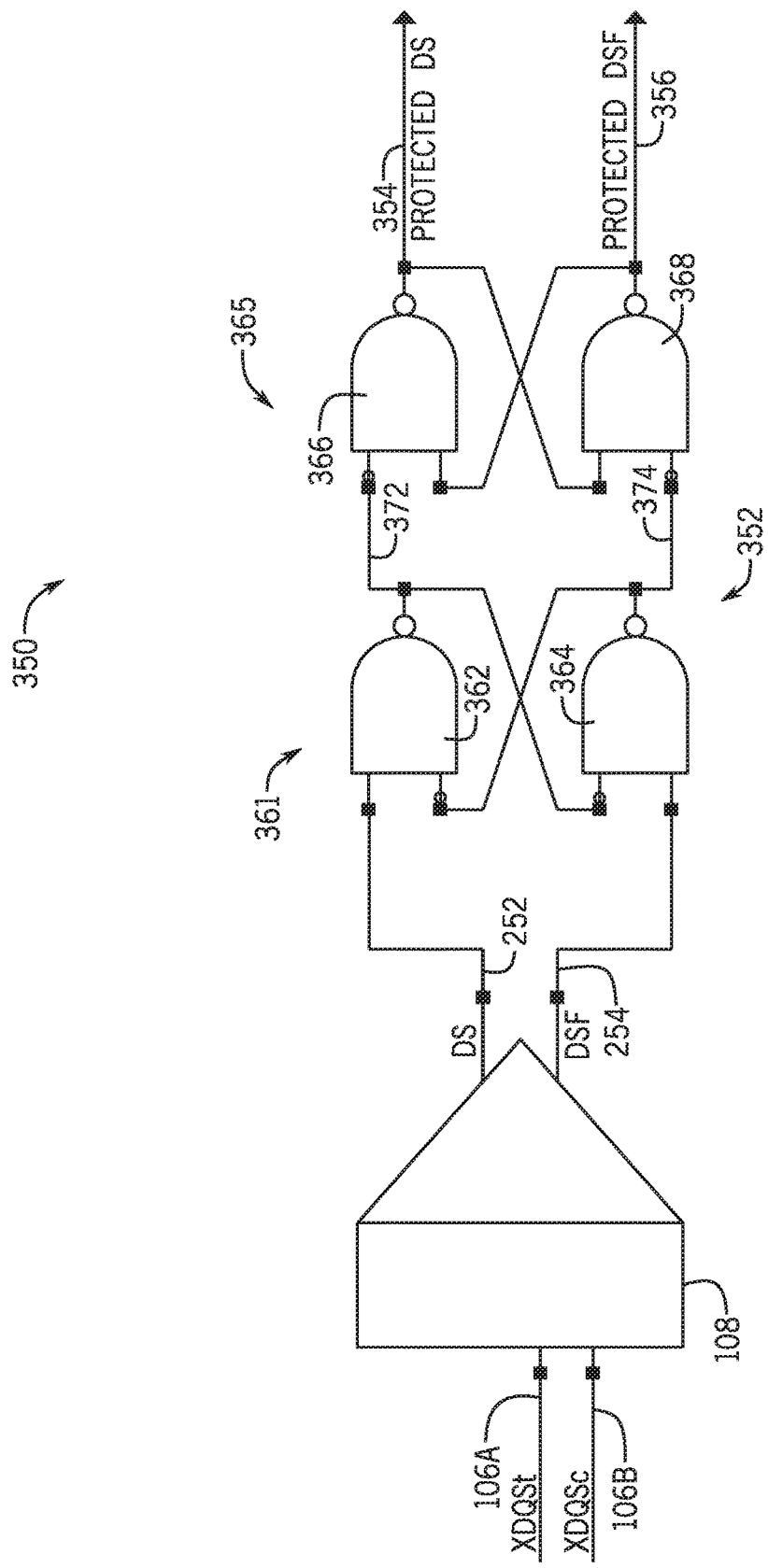
FIG. 7 is a block diagram of circuitry that includes a set/reset latch pipeline that may be used to prevent metastability, in accordance with an embodiment.

With the foregoing in mind, FIG. 7 illustrates an input circuit 350 having a pipelined set-reset (SR) latch arrangement 352 to produce protected internal signals DS 354 and DSF 356 that may be consistent and stable, and therefore, may prevent metastability propagation. Circuit 350 may receive the differential strobe signal pair XDQS_t 106A and XDQS_c 106B, which may be processed by comparator 108. Comparator 108 may produce a digital internal strobe signal DS 252 and complement strobe signal DSF 254. The first stage 361 of SR latch arrangement 352, which may have NAND gates 362 and 364, and the second stage 365 of the arrangement 352, which may have NAND gates 366 and 368, may hold output values (e.g., signals 372 and 374 for the first stage 361 and protected signals DS 354 and DSF 356 for the second stage 365) constant until both DS 252 and DSF 254 toggle.

As an example, if DS 252 presents a logic 1 and DSF 254 presents a logic 0, signal 372 presents a logic 0, signal 374 presents logic 1, protected output DS 354 presents a logic 1 and protected output DSF 356 presents a logic 0. Both signals will be held by the feedback in stages 361 and 365, and may only switch when both DS 252 and DSF 254 toggle consistent with the DQS strobe signal specification. In this example, if signal DSF 254 toggles such that both DS 252 and DSF 254 present logic 1 simultaneously, signals 372 and 374 do not toggle and circuit 350 may hold the previous values, preserving valid values in protected outputs DS 354 and DSF 356. Similarly, in this example, if signal DS 252 toggles such that both signals DS 252 and DSF 254 present logic 0 simultaneously, signal 372 may toggle to logic 1, but signal 374 does not toggle to logic 0 and remains in logic 1. As a result, feedback in the second stage 365 holds the values in protected outputs DS 354 and DSF 356.

As a result of the mechanism of the SR latch arrangement 352 described above, circuit 350 may prevent protected DS 354 and DSF 356 from toggling when receiving inconsistent strobe signals XDQS_t 106A and XDQS_c 106B, such as when they are not being driven by a processor. Note that this protection is provided by an addition of 2 NAND gates 362 and 364, which may create minimal impact to the latency of the input circuitry providing internal DS and DSF signals. Note further that, as discussed above with respect to FIG. 2, delay circuitry 112 may be further adjusted to compensate for any additional lag generated by the pipelined SR latch arrangement 352.

Figure 8:
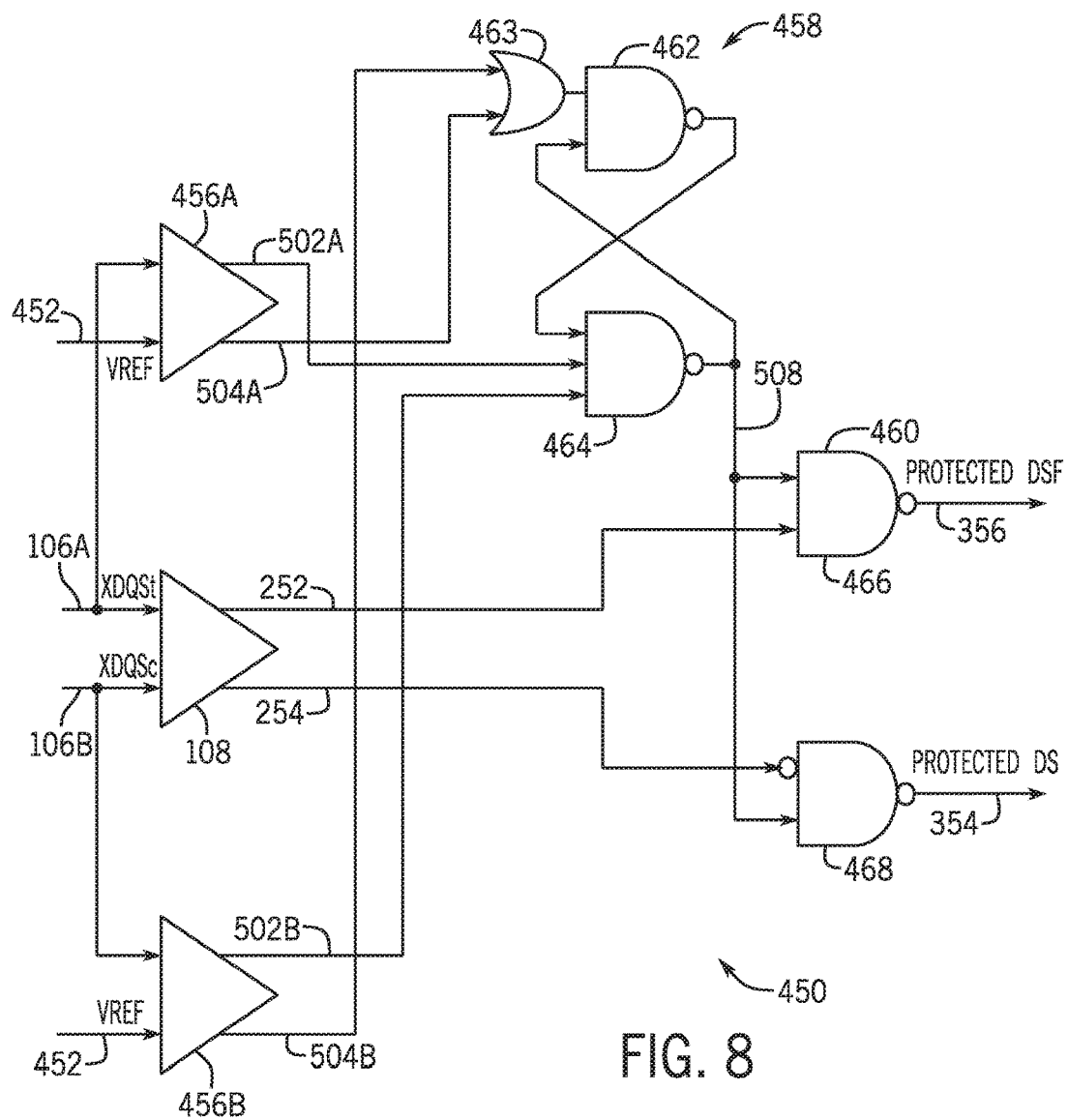
FIG. 8 is a block diagram of circuitry that includes a set/reset latch system with comparators and may be used to prevent metastability, in accordance with an embodiment.

It should be noted that comparator 108 for circuit 350 may employ a differential amplifier, which may accidentally produce a valid output from noise. This may be due to the fact that the differential amplifier may amplify any variations between strobe signals XDQS_t and XDQS_c due to noise, producing signal DS 252 that is a logic inverse of signal DSF 254. These signals, may still lead flip-flops in the input circuitry to metastability. Circuit 450 in FIG. 8 illustrates a single stage SR latch arrangement which compares the input strobe signals XDQS_t 106A and XDQS_c 106B with a reference voltage 452 to verify validity. Reference voltage may be a value set between around a mid-point between the high and low logic values in the electrical device. For example, if a logic 0 corresponds to ground, and a logic 1 corresponds to a 1.2 V, the value may be substantially between 0.5V and 0.8V. As a result, circuit 450 may prevent production of signals that may drive input circuitry to metastability with accidentally valid outputs from noise. To that end circuit 450 may employ comparators 456A and 456B (e.g., differential amplifiers) to compare input XDQS_t 106A and XDQS_c 106B with a reference voltage VREF 452. Voltage reference VREF 452 may be adjusted such that a logic 1 may be represented using a voltage higher than voltage reference voltage 452, and a logic 0 may be represented using a voltage lower than voltage reference voltage 452. Accordingly, signals 502A and 504A provided by comparator 456A may only toggle if XDQS_t 106A crosses the threshold VREF 452. Similarly, signals 502B and 504B provided by comparator 456B may only toggle if XDQS_c 106B crosses threshold VREF 452. The single stage SR latch arrangement 458 may receive the output signals from comparators 456A and 456B and may only toggle when signals 502A, 504A, 502B, and 504B toggle in a valid manner. Output signal 508 of the SR latch arrangement 458 may be used to gate signals DS 252 and DSF 256 in an output stage 460 to provide protected signals DS 354 and DSF 356.

The SR latch arrangement 458 may have gates 462, 463, and 464 arranged with a feedback line. In a valid input state, (e.g., signals 502A and 504A are logic inverse of signals 502B and 504B, respectively), NAND gate 464 produces an output signal 508 having logic 1, which is held by the feedback that includes the OR gate 463 producing a logic 1, and NAND gate 462 producing a logic 0. If the inputs XDQS_t 106A and/or XDQS_c 106B become undriven (e.g., not provided by the processor), their values may become inconsistent in comparison with the voltage reference 452, leading to signal 502A having the same logic value of signal 502B and signal 504A having the same logic value of signal 504B, resulting in output signal 508 transitioning to logic 0. For example, if both signals 502A and 502B transition to logic 1 and signals 504A and 504B transition to logic zero, OR gate 463 produces a logic 0 causing NAND gate 462 to toggle to a logic 1, which causes NAND gate 464 to toggle to a logic 0 at output signal 508.

Output stage 460 may receive the output signal 508 and use it to gate signals DS 252 and DSF 254 using gates 466 and 468. If the output signal 508 is a logic 1, AND gate 466 may produce a protected DSF signal 356 from the DS signal 252, and NAND gate 468 may produce a protected DS signal 354 from DSF signal 254. By contrast, if output signal 508 is a logic 0, AND gate 466 may produce a protected DSF signal 356 with logic 0, and NAND gate 468 may produce protected DS signal 354 with logic 1. Note that, as a result, protected DS 354 and DSF 356 are complementary (e.g., logic complements) when the inputs are invalid, preventing flip-flops of circuitry that receive the signals from entering metastable states. Note further that circuit 450 has a single gate (e.g., gates 466 or 468) in the path instead of the two gates (e.g., gates 362 and 366, or gates 364 and 368) in the path of circuit 350, which may lead to a decrease in the lag of the circuitry.

The implementations for circuits 350 and 450 may be used in combination to produce protected data strobe signals from differential pairs. For example, a two-stage SR latch of circuit 350 may be used in combination with gating circuitry that compares the differential pairs with reference voltages of circuit 450. Note further that the SR latches of circuits 350 and 450 may include appropriate "End Write" inputs to indicate the input circuitry that it should ignore further incoming strobe signals, such as following a write burst. As will be appreciated, while the specific circuits described employ specific gates, similar functionality may be obtained by altering the specific gates employed to perform similar role.

Figure 9:
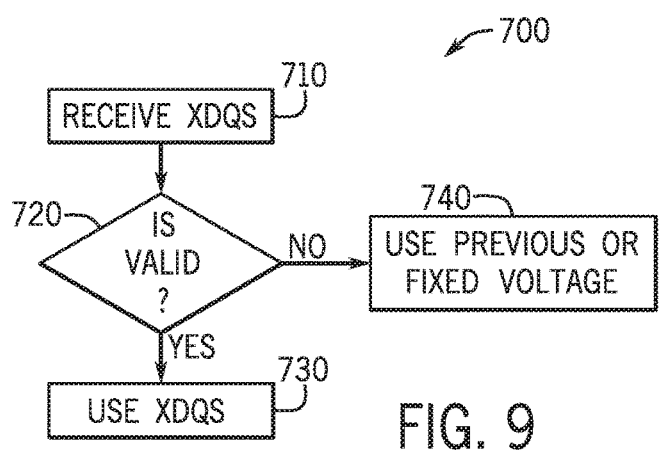
FIG. 9 is a flow chart of a method of operating circuitry that prevents metastability, in accordance with an embodiment.

The flowchart in FIG. 9 provides a method 700 for operation of an input system to prevent metastability. The input system may receive a high-frequency differential pair input via a tri-stateable line, a bidirectional line, or more generally, a line that may be disabled during certain periods. The input circuitry may receive the differential input signal XDQS in a process 710 and may pre-process the signal using comparators. The received signals may be verified for validity in a process 720. Circuit 350 may employ two-stage SR latches, and circuit 450 may compare the input data with a reference voltage, as described above. If the received signals are valid, input circuitry may enter a state that provides the processed input signal XDQS to the flip-flops (process 730). If the received signals are invalid, input circuitry may enter a state that provides a fixed voltage or holds the previous voltage (process 740). In circuit 350, validity may be indicated by the two-stage SR latches which may toggling only in response to valid changes in XDQS. In circuit 450, validity may be indicated by the comparator circuitry providing an output signal with used in output gating circuitry.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device comprising an input output interface comprising:
   a comparator configured to receive a differential strobe signal and to provide a digital strobe signal;
   a set-reset (SR) latch pipeline configured to receive the digital strobe signal, and to produce a protected digital strobe signal, wherein the protected digital strobe signal comprises the received digital strobe signal when the digital strobe signal is valid, and wherein the protected digital strobe signal is a previous digital strobe signal when the digital strobe signal is invalid; and
   at least one flip-flop configured to latch a received data signal using the protected digital strobe signal.

2. The memory device of claim 1, wherein the digital strobe signal comprises a data strobe signal, a data strobe complement signal, and wherein the digital strobe signal is invalid when the data strobe signal and the data strobe signal complement comprises the same logic value.

3. The memory device of claim 1, wherein the differential strobe signal is configured to couple to a bidirectional line.

4. The memory device of claim 1, wherein the comparator comprises a differential amplifier.

5. The memory device of claim 1, wherein the SR latch pipeline comprises two stages, and wherein each stage comprises a respective SR latch.

6. The memory device of claim 5, wherein each SR latch comprises two NAND gates, and wherein an output of the first NAND gate is coupled to an input of the second NAND gate.

7. The memory device of claim 5, wherein:
the first stage is configured to provide a previous output to the second stage when the received digital strobe signal comprises a first invalid state; and
the second stage is configured to provide a previous output as the protected digital strobe signal when the received digital strobe signal comprises a second invalid state.

8. The memory device of claim 5, wherein:
the first stage is configured to provide a previous output to the second stage when the received digital strobe signal comprises a third invalid state; and
the second stage is configured to provide a previous output as the protected digital strobe signal when a current input to the second stage received from the first stage comprises a fourth invalid state.

9. The memory device of claim 1, comprising a four-phase clock generator that is configured to receive the protected digital strobe signal and to produce four clock signals, wherein each of the four clock signals comprises half of a frequency of the protected digital strobe signal and phases of the four clock signals are in quadrature.

10. A memory device comprising:
a differential amplifier configured to receive a pair of differential strobe signals and provide a digital strobe signal;
comparator circuitry configured to compare each differential strobe signal of the pair of differential strobe signals with a reference voltage to produce comparison signals;
a latch configured to receive the comparison signals and provide a gating signal configured to indicate that the pair of differential strobe signals are valid based on the comparison signals; and
gating circuitry configured to receive the gating signal and the digital strobe signal and provide a protected strobe signal.

11. The memory device of claim 10, comprising a plurality of serially arranged flip-flops, wherein each flip-flop is configured to latch a received data signal using the protected strobe signal.

12. The memory device of claim 10, wherein a valid pair of differential strobe signals comprises a first strobe voltage that is higher than the reference voltage and a second strobe voltage that is lower than the reference voltage.

13. The memory device of claim 10, wherein the comparator circuitry comprises:
a first differential amplifier that receives a first strobe voltage of the pair of differential strobes and the reference voltage; and
a second differential amplifier that receives a second strobe voltage of the pair of differential strobes and the reference voltage.

14. The memory device of claim 10, wherein the reference voltage comprises a midpoint voltage between a power supply voltage of the memory device and a ground voltage of the memory device.

15. The memory device of claim 10, wherein the latch comprises a set-reset (SR) latch.

16. The memory device of claim 15, wherein the SR latch is configured to receive an end command that causes the SR latch to change the gating signal.

17. The memory device of claim 10, wherein the gating circuitry comprises:
an AND gate configured to receive the digital strobe signal and the gating signal, and to provide a protected digital strobe signal complement; and
a NAND gate configured to receive a digital strobe signal complement from the differential amplifier, and to provide a protected digital strobe signal.

18. A method to prevent metastability in input/output (TO) circuitry of a device, comprising:
receiving a pair of signals from an external device in the IO circuitry via an electrical connection, wherein the electrical connection is configured to be disabled;
comparing the first and the second signals of the pair of signals to produce a digital signal and a digital signal complement;
generating a validation signal using the received pair of signals, the digital signal, the digital signal complement, or any combination thereof;
selecting a protected signal from the digital signal or a fixed value based on the validation signal; and
providing the protected signal to a flip-flop of the IO circuitry.

19. The method of claim 18, wherein generating the validation signal comprises:
comparing the first signal of the pair of signals and a reference voltage to produce a first comparison signal;
comparing the second signal of the pair of signals and the reference voltage to produce a second comparison signal;
receiving in a latch of the IO circuitry the first and the second comparison signal; and
toggling the latch if the first and the second comparison signal correspond to an invalid received pair of signals.

20. The method of claim 18, wherein generating the validation signal comprises:
receiving the digital signal and the digital signal complement in a first stage set-reset (SR) latch; and
toggling an output of the first stage SR latch based on the received digital signal and digital signal complement; and
wherein selecting the protected signal comprises:
receiving the output of the first stage SR latch in a second stage SR latch;
toggling the output of the second stage SR latch based on the output of the first stage SR latch; and
providing the output of the second stage SR latch as the protected signal.

* * * * *